United States Patent [19]
Kohn

[11] Patent Number: 5,482,198
[45] Date of Patent: Jan. 9, 1996

[54] SOLDER PREFORM PICK-AND-PLACE MACHINE AND OPERATION

[75] Inventor: Harold Kohn, Endwell, N.Y.

[73] Assignee: International Business Machines Corporation, Armonk, N.Y.

[21] Appl. No.: 182,902

[22] Filed: Jan. 14, 1994

Related U.S. Application Data

[62] Division of Ser. No. 985,397, Dec. 4, 1992, Pat. No. 5,303,824.

[51] Int. Cl.$^6$ ................................................. B23K 37/00
[52] U.S. Cl. ................................. 228/6.2; 228/49.5
[58] Field of Search .................. 228/6.2, 44.7, 228/49.5, 56.3

[56] References Cited

U.S. PATENT DOCUMENTS

| | | | |
|---|---|---|---|
| 4,103,814 | 8/1978 | Nishioka | 228/9 |
| 4,320,865 | 3/1982 | Batinovich | 228/6.2 |

FOREIGN PATENT DOCUMENTS

| | | | |
|---|---|---|---|
| 59-105328 | 6/1984 | Japan | 228/6.2 |

*Primary Examiner*—Sasmuel M. Heinrich
*Attorney, Agent, or Firm*—Michael R. Belk

[57] ABSTRACT

Ten holders containing preforms are stacked on a rectangular bottom frame with different sized threaded posts of the bottom frame extending up through the hole and slot in opposite corners of each holder. An empty holder and then a dust cover with apertures at opposite corners are similarly stacked on the bottom frame to hold and protect the preforms. A top frame with apertures at opposite corners is positioned on the posts. The stack is compressed between the top frame and the bottom frame by screwing nuts onto the threaded posts to form a carrier in which the cavities are sized relative to the preforms to hold the preforms in position during transport to a pick-and-place machine without contaminating or damaging the delicate coating of dry flux. The holders are unstacked and positioned on different sized posts extending upward from a pick-and-place machine. A robot arm with a rubber tipped vacuum probe picks up the preforms without damage or contamination and places them on a circuit board, grippers of the robot arm pick up and position a component on an induction coil to heat it up sufficient for reflow soldering, and then move the component onto the preform on the circuit board for reflow soldering. The circuit board can be used without cleaning with solvents or CFC's, thus reducing process steps and reducing environmental hazards.

10 Claims, 7 Drawing Sheets

SOLDER PREFORM PICK-AND-PLACE MACHINE AND OPERATION

This is a divisional of application(s) Ser. No. 07/985,397 filed on Dec. 4, 1992 now U.S. Pat. No. 5,303,824.

AREA OF ART

This invention relates to solder-preform production, preform transportation, and circuit board production.

BACKGROUND

In the production of circuit boards, connection of some components require relatively large areas of accurately measured volumes of solder. Commonly used mass-soldering application processes such as wave soldering are unable to provide the required solder volumes. Therefore, when large volumes are required to connect a component, flat preformed shapes of solder are positioned between the component and the circuit board, then the board, solder-preform and component are heated usually in an oven for reflow soldering the component to the board.

Individual solder-preforms are transported in bulk containers whether they are prefluxed or unfluxed, then they are removed from the bulk containers and positioned on a circuit board by hand or positioned in fixed trays for automatic application to the circuit board using a pick-and-place machine, Utilizing tubes and boxes for bulk distribution and dispensation are well-known. Robust flux coatings are available for the preforms which will not be damaged during bulk transportation. Alternatively, flux pastes and powders are available which can be applied to the preform or to the component and circuit board during preform application or soldering. These fluxes are highly active so that contamination is not a problem. After reflow, the flux is cleaned from the solder joint using solvents sufficiently mild to prevent damage to the circuit board.

Recently no-clean fluxes have become available which eliminate the need to clean the circuit board with solvent after reflow soldering. The no-clean fluxes consist of a adipic acid or citric acid in a mild solvent such as water or an alcohol. The solution is applied to the components or to a solder preform and dried before soldering.

U.S. Pat. No. 3,351,192 to La Plate discloses a "package for cemented carbide inserts." U.S. Pat. No. 3,396 discloses an "applicator for simultaneously applying a plurality of bodies of solder . . . When sheet 10 is transparent, the end of the heating cycle is easily observed." U.S. Pat. No. 4,209,893 to Dyce et al. discloses "A solder pack consists of a thin heat resistant carrier board having spaced holes therethrough in which are held solder rings." U.S. Pat. No. 4,354,629 discloses "solder material disposed between two polymeric layers, one of which is provided with window means to control the flow of solder."

SUMMARY OF THE INVENTION

An object of the invention is to conveniently apply a no-clean flux liquid to solder-preforms and subsequently to dry the preforms.

Another object is to protect the solder-preforms in order to prevent damage or contamination to the no-clean flux coatings during transport.

Another object is to provide the preforms in an accurately positioned planar array for automatic application to a circuit board by a pick-and-place machine.

A further object is to support the preforms from their edges with the major surfaces separated from other surfaces during application of no-clean flux liquid and during drying so that the resulting flux coating is uniform.

Another object is to circulate air to the bottom surface of the preforms for drying.

Another object is to provide a self-centering holder cavity to provide accurate positioning of the preforms with respect to the holder.

Another object is to provide an automatic pick-and-place machine which provides for accurate positioning of a holder in relation to the machine for automatic removal of preforms from the array and accurate positioning of the preforms on a circuit board.

Another object is to provide a pick-and-place machine with a rotary table having multiple positions for accurately positioning a holder to prevent interruption of circuit board production.

Another object of the invention is to provide a circuit board with accurately positioned, high reliability, no-clean solder joints.

DETAILED DESCRIPTION OF THE DRAWINGS

Figure 1:
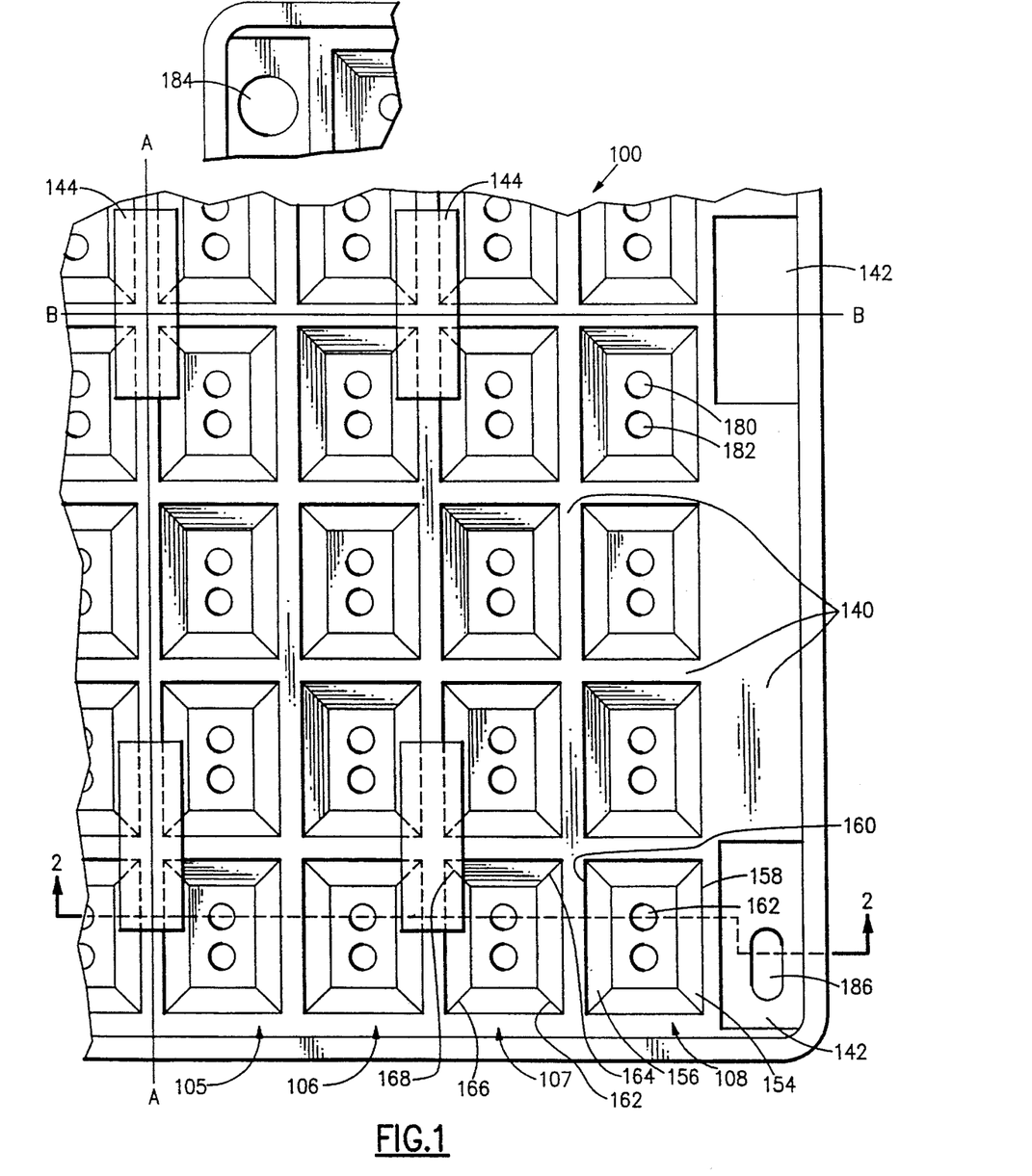
FIG. 1 is a bottom view of part of the holder the invention, and shows spacers connected to the holder bottom.

FIG. 1 shows a bottom view of a specific embodiment of the preform holder 100 which is part of the invention of applicant. Holder 100 is symmetric in two directions about line A—A and also about line B—B, except for the holes and slots in the corners. Preferably, there is only one slot and it is in the lower right corner and there is only one hole and it is in the upper left corner as shown. There are no holes or slots in the lower left and upper right corners of holder 100.

Figure 2:
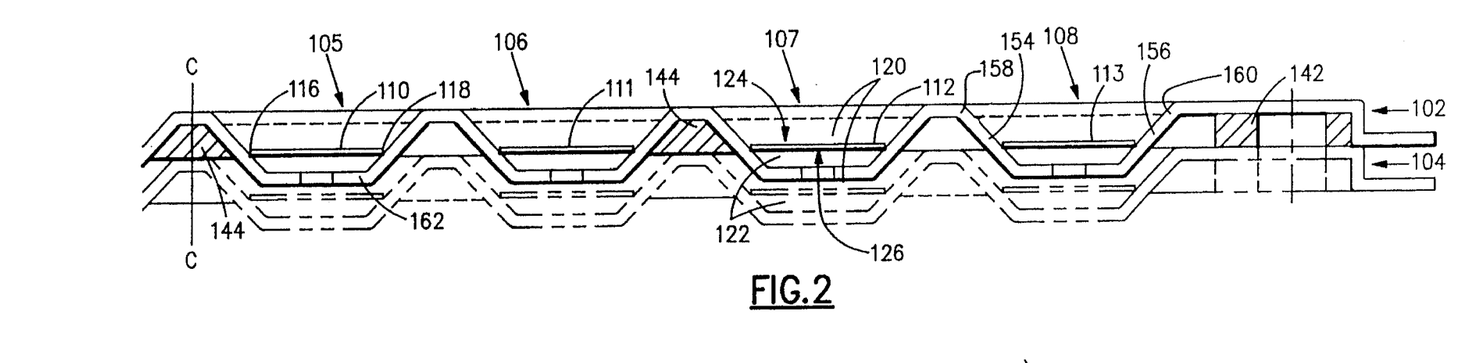
FIG. 2 is a section through line 2—2 of the part of the holder of FIG. 1, and in addition shows solder preforms in the cavities and shows a lower holder in stacked position in phantom.
Figures 3, 4:
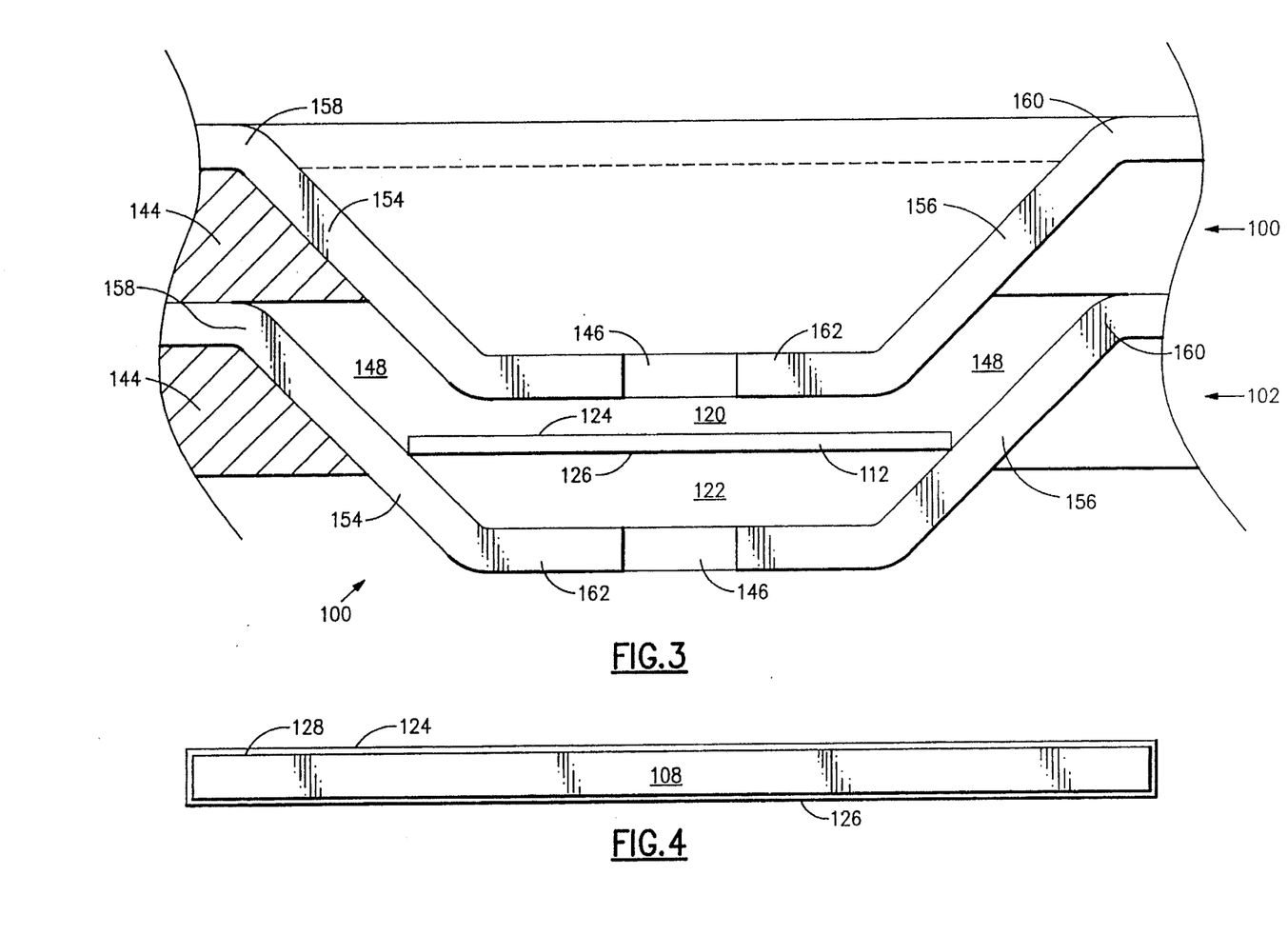
FIG. 3 is an expanded view of a cavity of FIG. 2.
FIG. 4 is an expanded view or the solder-preform with a coating of no-clean flux exagerrated in thickness for illustration.

FIG. 2 shows a side view partial section of the right half of a preform-holder 102 in phantom. The holders are symmetric about line C—C, except for holes and slots as described above. In FIG. 2, solder-preform holder 102 includes vacuum-formed supports (cavities) 105 through 108, for supporting multiple planar solder-preforms 110 through 113 by preform edges 116, 118 in a horizontal position. FIG. 2 also shows a lower holder 104 in phantom to illustrate the relationship between an upper and an adjacent lower holder in a stack. FIG. 3 is an enlarged view of a cavity of empty top holder 100 and of lower holder 102. When stacked, no other surfaces are in close proximity to the major surfaces 124 and 126 of preform 112 in order to prevent trapping liquid at 120 above the top surface and at 122 below the bottom surface of the preforms, and to allow air to circulate to both major sides 124 and 126 of preform 112. This prevents damage or contamination of a delicate layer 128 (shown in FIG. 4) of no-clean flux which coats the major surfaces 124,126 of the preform.

Figure 5:
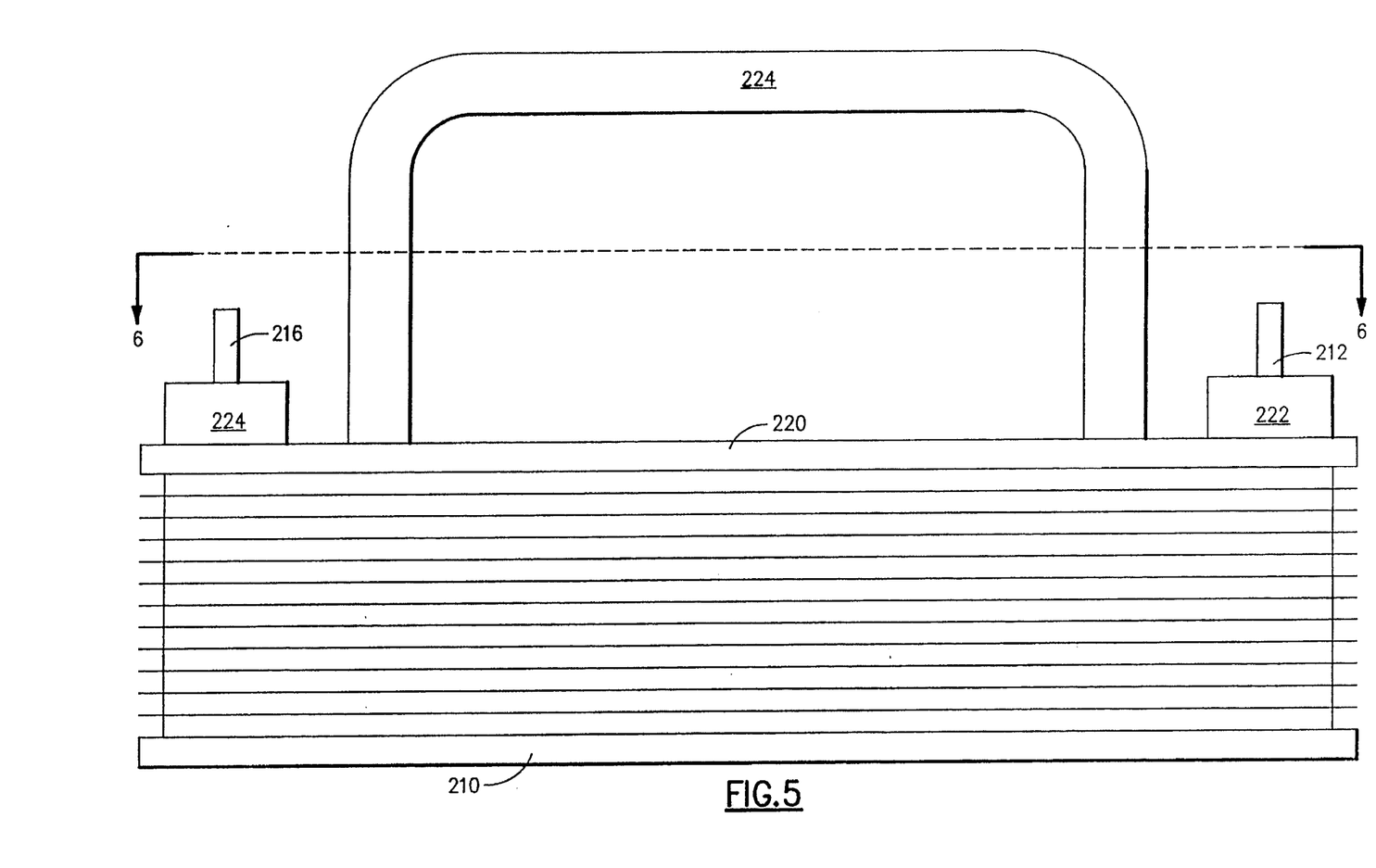
FIG. 5 is a side view of the carrier of the invention.
Figure 7:
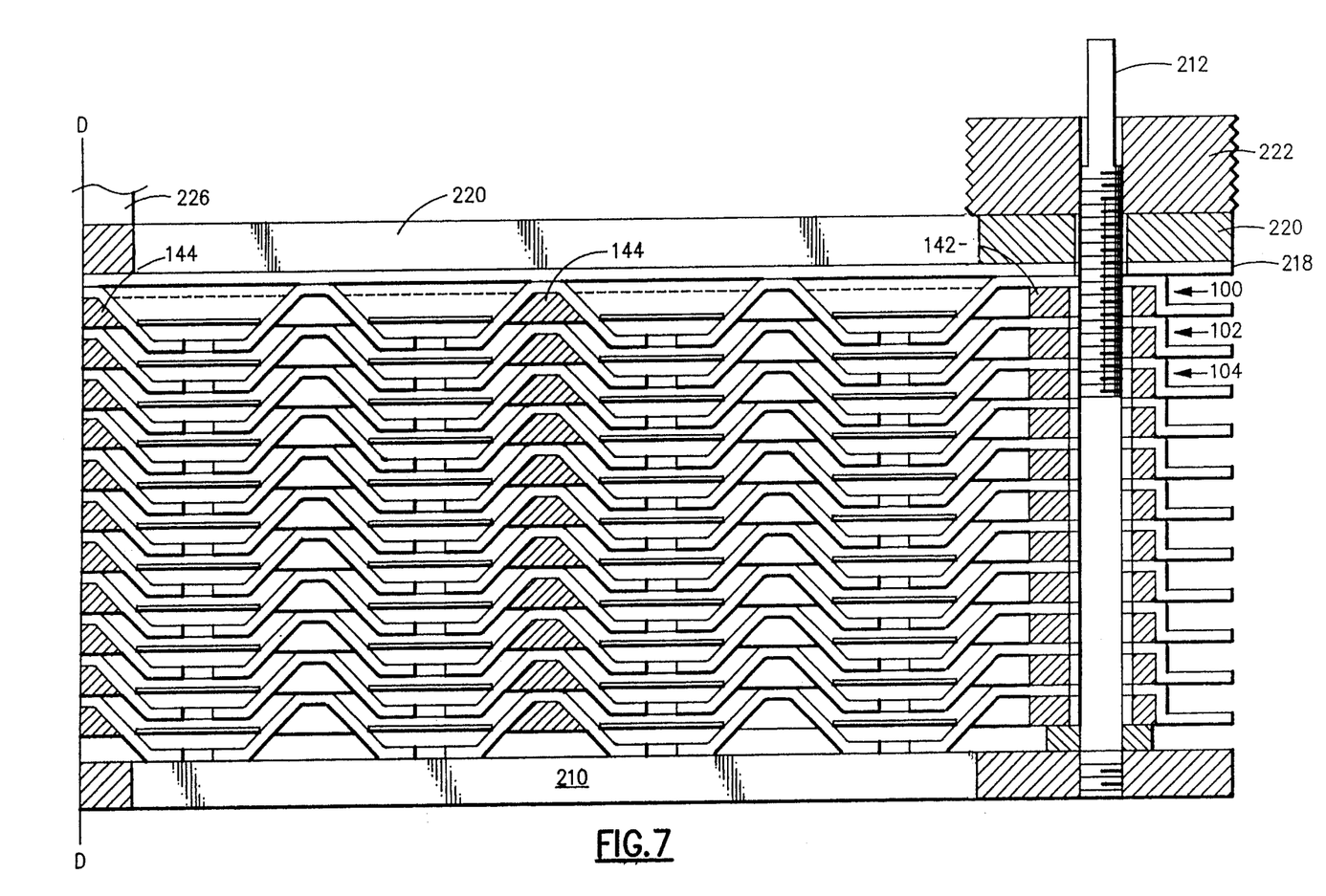
FIG. 7 is a side view partial section through lines 7—7 of FIG. 6 of a part of a carrier of the invention illustrating parts of 10 holders with preforms, and a top holder without preforms.

In FIG. 1, holder-frame 140 positions the vacuum-formed cavities 105 through 108 of each row to hold the preforms in a two-dimensional array within a horizontal plane. As best illustrated by FIG. 2 by holder 102, each holder also includes stacking apparatus which preferably includes spacers 142 and 144 to provide for accurately positioning multiple preform holders in a compressed vertical stack as shown in FIG. 5. In FIGS. 2 and 7 for each holder, rectangular cross section spacers 142 and frustro-triangular cross section spacers 144 support an upper holder 102 above a duplicate lower holder 104 (shown in phantom in FIG. 2) to accurately control extension of the bottoms 162 of the cavities of the upper holder into the open tops of the cavities of the lower holder, as best shown in FIG. 3. The extension is sufficient to hold the preforms in the bottom holder approximately in place and prevent migration of the preform into position between the sidewalls of the upper and lower cavities when the holder is moved or tilted during transport.

As shown in FIG. 3, the spacers provide sufficient vertical clearance between the bottom 162 of the upper cavity and the preform to prevent trapping of liquid at 120 and to provide air circulation between preforms in the lower holder 102 and the bottom 162 of the cavities of upper holder 100. The invention also includes passages 146 for air circulation through space 122 below the bottom of the preforms when the preform holders are stacked and includes passages 148 for air circulating through the space at 120 above the top surface of the preforms when the holders are stacked.

Preferably, as shown in FIG. 1, holder-frame 140 includes a continuous sheet to which the supports are attached, and the supports include an array of cavities (shaped as frustrums of rectangular pyramids) in a horizontal plane in which each cavity has an open top end integrally and continuously connected to the sheet (as shown in FIGS. 2 and 3 at 158 and 160 of each cavity) for horizontally positioning the cavities within the array. As shown in FIG. 1, each cavity includes four flat sidewalls 150, 152, 154 and 156 projecting in the same direction from the sheet with the edges of the walls integrally and continuously interconnected, as shown in FIG. 1 at 162, 164, 166, and 168. Also, all the walls 150, 154, 156, 158 of each cavity slope inwardly at the same angle toward the center of the cavity and connect continuously and integrally all around at 170, 172, 174 and 176 to the rectangular bottom wall 162. The slope of the sidewalls is sufficiently small to guarantee that the solder-preforms do not become wedged between the sidewalls in the cavities depending on the materials, geometries and tolerances of the holder and preforms. Preferably, the slope of the sidewall is sufficiently large to provide self-centering of the solder-preforms within a few mills during very low amplitude vibration of the solder-preform carrier and to provide high density of cavities on the sheet. Preforms are centered in the cavities even if slightly undersized or oversized. For example, an angle of 30 to 60 degrees is satisfactory and 45 degrees, as shown, is preferred.

Preferably, the bottom wall is smaller than the solder-preform for positioning the preform sufficiently far from the bottom wall, depending on viscosity of the liquid and tolerances of the preforms and holder dimensions, to prevent liquid from becoming trapped between the preform and the bottom at 122 during liquid treatment of the preforms. Also, passage 146 for air circulation, preferably include one or more round holes 180 and 182 in the bottom wall of each cavity to provide for circulating dry air from outside the holder across the bottom of a preform in the cavity and to drain any excess liquid out of the bottom of the cavity.

Preferably, the materials of the holder are clear for visually inspecting the delicate flux coating on the bottoms of the preforms without disturbing the preforms or contaminating the flux coating. Preferably, the sheet is a moldable polymeric material and the cavities are vacuum molded from the sheet to provide a smooth continuous integral joint between the same materials and with the same thickness to provide maximum reliability at minimum costs. Most preferably the material is a clear polycarbonate.

Preferably, as shown in FIG. 1, holder 100 is rectangular and includes indexing apparatus for accurately positioning the holder with respect to a pick-and-place machine for automated removal. The indexing apparatus may include a hole 184 in one corner of the holder and a slot 186 in the opposite corner for accurately positioning of the holder for automated removal of the preforms. The corner hole and slot may be produced by punching or drilling/routing. Preferably the width of the slot is substantially different from the diameter of the hole so the holder can only be placed in one upright position on a pick-and-place machine for automatic accurate removal, for example, hole 184 is shown with a larger diameter than the width of slot 186.

Preferably, each cavity is at least 2 mm deep and contains a thin, rectangular, planar, solder-preform having a delicate uniform coating on each major side of contamination-free no-clean flux and having major dimensions in relation to the major dimensions of the cavities for supporting each edge of the preform on the inwardly sloping sidewalls of the cavity, preferably, at least 1 mm above the bottom of the cavity. Spacers 142 and 144 are sized to guarantee enough extension of the bottom of the cavities of an upper holder into the cavities of a lower holder to keep the preforms in the cavities and some clearance between bottoms of the cavities of the upper holder and solder-preforms in a lower holder when the holders are stacked; generally at east 1 mm. Preferably, the material of the holder is treated in a well-known manner to be anti-static anti-outgassing for minimizing contamination of the preform during drying and storage. For example, the cavities may be 5 mm deep and spacers 3 mm thick to provide an upper clearance of 1 mm and lower clearances of above 2 mm between a horizontal preform and cavity bottom walls of upper and lower holders.

Figure 6:
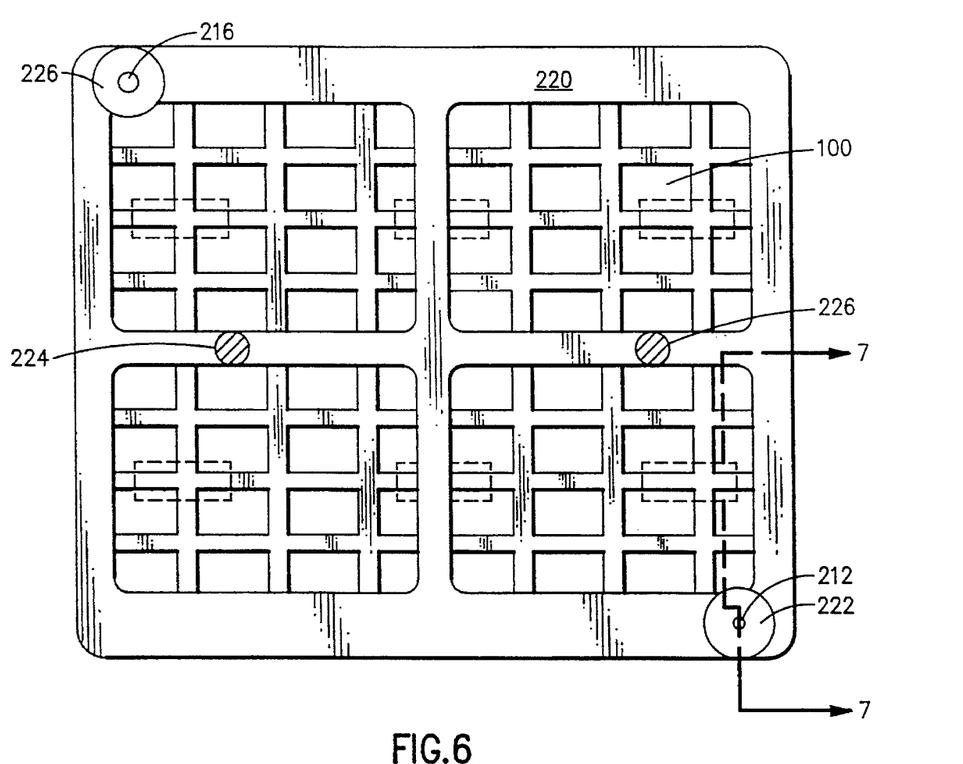
FIG. 6 is a top view partial section through lines 6—6 of the carrier shown in FIG. 5.

FIG. 5 shows a side view of the preform carrier of the invention. FIG. 6 shows a top view partially in section along the lines 6—6 of FIG. 5. FIG. 7 shows a side view partial section along lines 7—7 of FIG. 6 illustrating the right half of a preform carrier which is symmetric about line D—D except that preferably, one of the posts is substantially larger in diameter than the other (as shown in FIGS. 5 and 6) so that the preform holders can only fit on the posts in one upright position. As shown in FIG. 7, a preform carrier includes a vertical stack of the preform holders 100, 102, 104 etc., and apparatus for horizontally positioning the holders in relation to each other and for clamping the holders in the vertical stack rigidly together in compression so that preforms do not slip out of place if the carrier is tilted or horizontally accelerated. The holding and clamping apparatus includes a rigid rectangular bottom-frame 210 with a threaded post 212 in one corner of the bottom-frame extending upward through slots (186 in FIG. 1) in the corner of each holder and a second, threaded post (216 in FIGS. 5 and 6) at the opposite corner of the bottom-frame extending upward through holes (184 in FIG. 1) in the opposite respective corner of each holder.

Preferably about 10 holders containing solder preforms 102, 104, etc. are stacked on the posts of the bottom-frame, then an empty preform holder 100 is placed on the stack to maintain the preforms in holder 102 in place. Then a flat continuous sheet 218, also containing respective apertures at opposite corners, which may be a hole and a slot, is positioned on the stack of preform holders to protect the preforms, for example, from dust or falling water. A rigid top-frame 220 (best seen in FIG. 6), having corresponding apertures in respective opposite corners is positioned on the stack with the posts extending through the apertures. The bottom frame has the same general shape as the top frame in FIG. 6.

Nuts 222 and 224 are threaded onto the posts and screwed against the top-frame to compress the stack of preform-holders together between the top and bottom frames so the preforms can not move out of position during transport. Also, a handle 226 is provided which extends upward in a loop on the top-frame for manually lifting the preform carrier.

Figure 8:
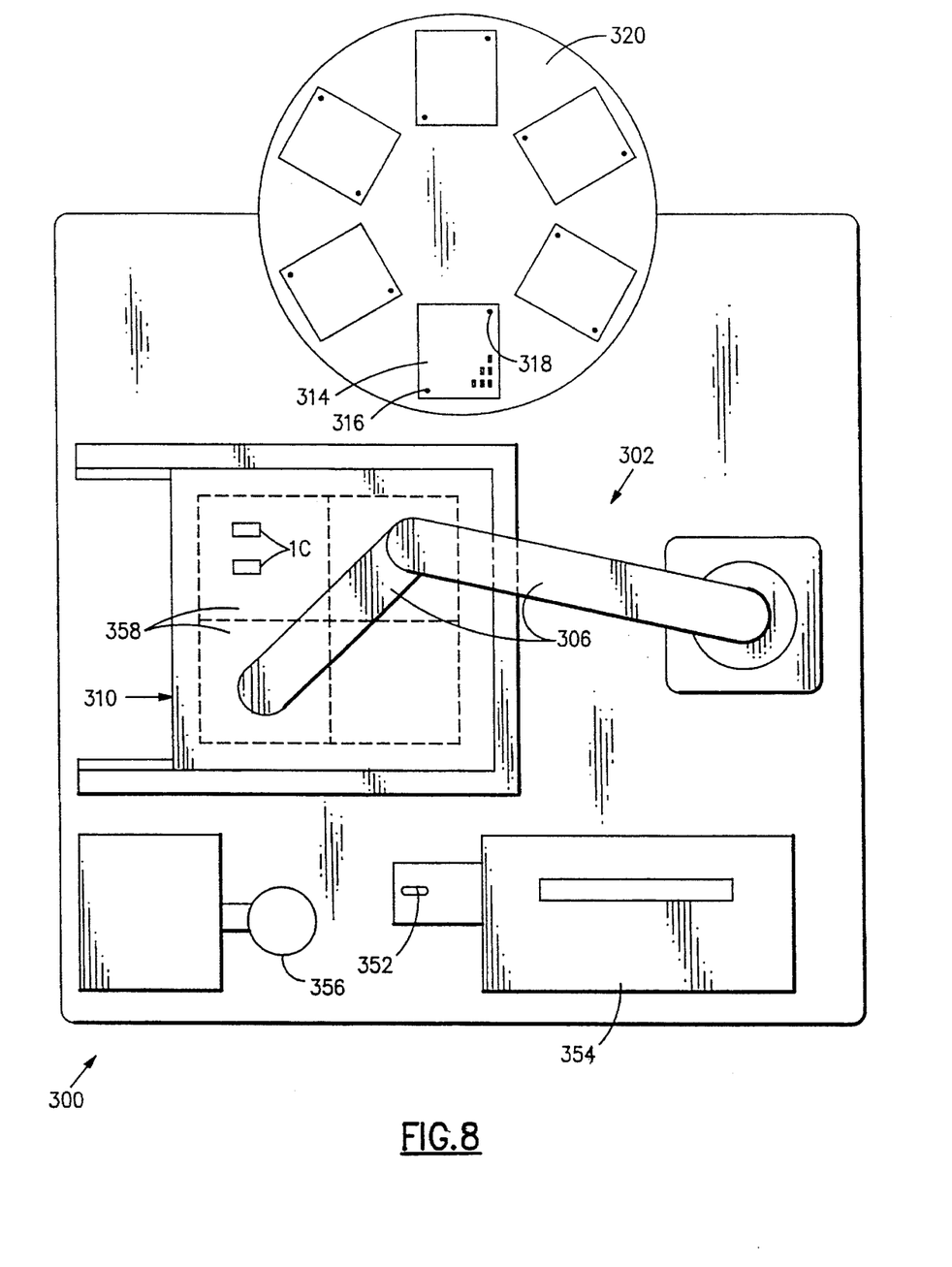
FIG. 8 is a schematic plan of the pick-and-place machine of the invention.
Figure 9:
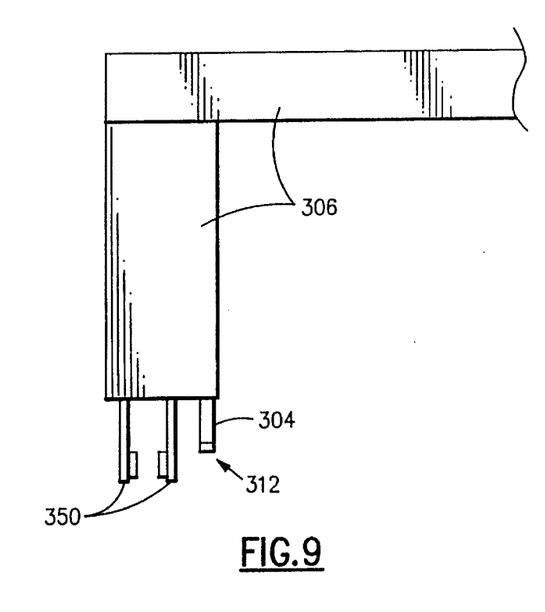
FIG. 9 is a schematic side view of the probe and gripper at the end of the robot arm of FIG. 8.

As shown in FIGS. 8 and 9, the invention also includes a solder-preform pick-and-place machine 300 which has a preform picking means 302, preferably with a vacuum probe 304 on a robot arm 306, for automatically and sequentially picking solder-preforms up from each respective cavity of a solder-preform holder 308 and for placing the preforms on circuit board 310. The surface of tip 312 of the vacuum probe is preferably a soft elastomer, such as rubber to seal against the delicate no-clean flux coating without damaging the coating for picking up the preform. The robot sequentially picks up solder preforms from preform holder 314 and places them on one or more circuit boards 310. Post means such as two or more posts 316, 318 extending upward through the apertures at opposite corners of the solder-preform holder, accurately position the holder in relation to the solder-preform picking means for picking up a solder preform from each cavity of the array of cavities of the holder and for accurately placing the preform on a circuit board. Preferably, a pair of posts have different diameters (as previously described for the preform carrier bottom frame) to correspond to differently sized hole and slot of the preform holders so there is only one correct upright position for each holder at each holder position in the pick-and-place machine.

Preferably the pick-and-place machine includes a table 320 with multiple locations for solder-preform holders. The table can be rotated to allow solder-preforms to be picked from each respective location, to provide for unattended operation for extended periods, and to allow empty holders to be replaced with full holders while the pick-and-place machine operates, preventing delays in operation. Each position includes a pair of the positioning posts of different size to snugly conform with the respective hole and slot for one respective preform holder.

Preferably, robot arm 306 is also provided with a gripper 350 for picking up a component 352 from component dispenser 354 and an induction coil 356 to heat the component sufficiently for reflow soldering of the preform. A heater 358 (shown in phantom), such as an IR heater, may be provided by means well-known in the art to preheat the circuit board to near soldering temperature.

The solder-preform holders are manufactured by heating a sheet of thermoplastic resin above the transition temperature and molding an array of continuous, rectangular section, frustro-pyramidal shaped cavities as described above. Then forming one or more holes in the bottom of each molded cavity by drilling or punching for draining liquid from the cavity and admitting circulating air to dry the bottom side of the preform; and connecting the previously described spacers to the bottom surface of the holder, preferably by gluing with epoxy. Also, a round hole is punched in one corner and an oblong slot is punched in the opposite corner of the sheet preferably with the width of the slot substantially different from the diameter of the hole as described above.

The preform holders are used for treating the solder-preforms. The planar solder-preforms are inserted in a horizontal position with each edge of the preform supported by an inwardly tapered wall of a respective cavity of the preform holder as previously described. No-clean flux liquid is introduced to the preforms in the holder.

Preferably a measured amount of no-clean flux, dissolved in a liquid, is dispensed onto a first major side of each preform to form a liquid coating while positioned in a first preform holder. Then a second preform holder is positioned in an inverted position over the first preform holder and both preform holders are simultaneously flipped over to position the preforms in the second preform holder without affecting the liquid coating. Then a measured amount of the no-clean flux solution is dispensed onto the other major side of each preform in the holder.

The coating of flux liquid may be inspected by looking through the bottom of the holder prior to stacking. The preforms may be dried either before or after the holders are assembled into carriers by stacking and clamping the holders between the frames. Preferably the preforms are dried at substantially above ambient temperature for faster drying, and then the dry powder coating is inspected before carrier assembly.

In the invention, a circuit board 310 is manufactured by transporting the preform carrier to a pick-and-place machine, unstacking the preform holders from the carrier frames, and positioning the holders at posts on the machine. The preforms are vacuum picked up from holder 316 and placed on circuit board 310. Measurement is not necessary since vibration of the machine is sufficient to center each solder preform in its respective cavity in the holder within a few mils and the holders are accurately positioned on the posts. Then components 352 are picked up using gripper 350 and placed on induction coil 356 and heated sufficiently to provide energy for reflow soldering the preforms, and then the component is placed onto the circuit board over the preforms. Alternately, the circuit board, preform and component can be heated sufficiently on site or in an oven (not shown) for reflow soldered connection of the component to the circuit board. Then the circuit board is allowed to cool. No-clean flux does not leave contamination which could lead to insulation-resistance shorts. Also it does not require cleaning with CFC's, methylene chloride or other solvents prior to utilizing the board.

I claim:

1. A solder-preform pick-and-place machine comprising: vacuum means for automatically and sequentially for each solder-preform of a two dimensional stationary array of preforms, applying vacuum and moving vertically for picking the solder-preform up from a respective position of the solder-preform holder, moving in two horizontal axis to a selected position above a stationary circuit board, and moving vertical and controlling the vacuum for placing the preform at a predetermined respective position on the circuit board accurately in horizontal directions as well as rotationally;

post means for accurately positioning the solder-preform holder in relation to the vacuum means in a stationary position for picking up a solder-preform from each position of a two dimensional array of positions of the holder and accurately placing the preform on a stationary circuit board.

2. The machine of claim 1, in which the machine further comprises:

a solder-preform holder with cavities having sidewall angles sufficiently large to provide self-centering of the solder-preforms in the cavities due to vibration during operation of the machine to provide accurate placement of the preforms within a few mils without utilizing a measurement system.

3. The machine of claim 1, in which the machine further comprises:

a table with multiple locations for solder-preform holders which can be rotated between a fixed position for each holder location to allow solder-preforms to be picked from each respective location to provide for unattended operation for extended periods and in which empty holders can be replaced with full holders while the pick-and-place machine operates on a different holder for preventing delays in operation.

4. The machine of claim 1, in which the vacuum means include a robot arm with an elastomer surfaced vacuum pickup which automatically and sequentially picks up solder-preforms from a holder and places the preforms on the circuit boards.

5. The machine of claim 1 further comprising heating means for reflowing the solder-preforms.

6. The machine of claim 5 in which the heating means includes an IR heater for the circuit board and an induction heater for the components.

7. A solder-preform pick-and-place machine, comprising:

vacuum means for automatically and sequentially picking solder-preforms up from each respective cavity of a solder-preform holder and for placing the preforms on circuit boards;

post means for accurately positioning the solder-preform holder in relation to said solder-preform picking means for picking up a solder-preform from each cavity of an array of cavities of the holder and accurately placing the preform on a circuit board;

a table with multiple locations for solder-preform holders which can be rotated to allow solder-preforms to be picked from each respective location to provide for unattended operation for extended periods and in which empty holders can be replaced with full holders while the pick-and-place machine operates for preventing delays in operation;

and in which:

vacuum means include a robot arm with an elastomer surfaced vacuum pickup which automatically and sequentially picks up solder-preforms from a holder and places the preforms on the circuit boards; and at least two posts are positioned at every solder-preform holder location on the table for insertion through apertures in opposite corners of the holders to accurately position the holders.

8. The machine of claim 7 in which each of the two posts at each holder location are of a substantially different cross section for restricting the holder position to a single correct orientation.

9. A solder-preform pick-and-place machine comprising:

a solder-preform holder having cavities for solder-preforms, with sidewall angles sufficiently large to provide highly accurate self-centering of preforms in the cavities due to vibration during operation of the machine;

vacuum means for automatically and sequentially picking the accurately centered solder-preforms up from each respective cavity of a solder-preform holder and for accurately placing the preforms on circuit boards;

post means for accurately positioning the solder-preform holder in relation to said solder-preform picking means for picking up a solder-preform from each cavity of the holder and accurately placing the preforms on a circuit board.

10. The machine of claim 9 in which:

the cavities form a two dimensional matrix of solder-preform positions;

the machine further comprises means for holding the solder-preform holder in a fixed position relative to the circuit board to which the solder-preforms are transferred to an array of different locations during the transfer of solder-preforms; and the vacuum means includes robot arm means for moving a vacuum pick biaxially for sequentially moving to each preform holder position to pick up a solder-preform and then moving to a selected position of the circuit board for placing the solder-preform.

\* \* \* \* \*